United States Patent

Kaminski

[15] 3,646,364

[45] Feb. 29, 1972

[54] CIRCUIT FOR REDUCING SWITCHING TRANSIENTS IN FET OPERATED GATES

[72] Inventor: William Kaminski, West Portal, N.J.

[73] Assignee: Bell Telephone Laboratories, Incorporated, Murray Hill, N.J.

[22] Filed: Nov. 17, 1969

[21] Appl. No.: 877,088

[52] U.S. Cl. ..............................307/251, 307/240, 307/304, 321/44, 328/165, 330/9, 330/149, 332/37

[51] Int. Cl. ..............................H03k 17/60

[58] Field of Search..................307/205, 251, 240, 279, 304; 328/165, 265; 330/149, 30 D, 9; 332/18, 37; 321/44

[56] References Cited

UNITED STATES PATENTS

| | | | |
|---|---|---|---|
| 3,363,166 | 1/1968 | Ohashi et al. | 321/44 |
| 3,397,353 | 8/1968 | Hitt et al. | 307/251 X |
| 3,458,799 | 7/1969 | Collings | 330/9 X |
| 3,469,173 | 9/1969 | Ohashi et al. | 307/240 X |
| 3,495,097 | 2/1970 | Abramson et al. | 307/251 X |
| 3,510,684 | 5/1970 | Martin | 307/251 X |
| 3,521,087 | 7/1970 | Lombardi | 307/304 X |
| 3,522,519 | 8/1970 | Peterson | 307/240 X |

*Primary Examiner*—Stanley T. Krawczewicz
*Attorney*—R. J. Guenther and Kenneth B. Hamlin

[57] ABSTRACT

An FET analog gate includes two equal-valued resistors, one in the source path and one in the drain path of the FET, and a differential amplifier, one input connected to the FET source terminal and the other input connected to the FET drain terminal.

1 Claims, 7 Drawing Figures

INVENTOR
W. KAMINSKI
BY Lucian C. Canepa
ATTORNEY

CIRCUIT FOR REDUCING SWITCHING TRANSIENTS IN FET OPERATED GATES

BACKGROUND OF THE INVENTION

This invention relates to field effect transistor (FET) circuits and more particularly to means for eliminating transient responses from field effect transistor switching circuits.

In general, field effect transistors are well adapted for use in gate and chopper circuits. One of the disadvantages, however, which has retarded the use of FET's in these applications has been the incidence of spurious transient responses in the source and drain paths due to the control or gate signal. These spurious responses, in the form of transient spikes, are solely the result of the coupling effect of interelectrode capacitances between the gate and drain terminals and the gate and source terminals.

The transient spikes caused by the interelectrode capacitances in the FET can cause the triggering of circuits responsive to a signal of a particular threshold level at the output of the FET circuit. That threshold may be caused to be exceeded by a below-threshold output signal enhanced by a transient spike. Alternatively, the peak magnitude of the spikes may be several times larger than expected for a particular system and thus may overload succeeding stages.

In the past these transient spikes were eliminated in a number of ways. One method entailed the use of complementary FET devices. The major drawback inherent in this practice resides in the fact that it is prohibitively expensive to manufacture complementary FET's having identical characteristics. Further, in the field of integrated circuit development, to which FET's are most adaptable, there is a problem in that N- and P-channel devices (which are needed for complementary configurations) inherently have different characteristics when fabricated together; that is, the N-channel devices are depletion mode, while the P-channel devices are enhancement mode. The added processing, such as additional diffusion and photomasking steps, necessary to achieve monolithic complementary circuits increases the cost and reduces the yield. Additional drawbacks arise first, because both polarity devices exist side by side requiring that some form of isolation be used and second, because the number of devices required to implement a given function is greater than in the single-polarity case.

Further, since it is clear that the interelectrode capacitances are the means whereby the gate signal is coupled to the source and drain, another prior art method prescribes that the FET be made to have interelectrode capacitances as small as possible. Reducing the physical size of the FET reduces the undesirable parasitic capacitance, but increases the resistance of the device when it is ON, an undesirable effect in most applications.

Still another well-known means for reducing the transient level is to reduce the rise and fall times of the gate signal. The gate signal is characteristically and preferably a square wave function. However, the fast rise and fall times inherent in a square wave generate high-level transient spikes. Use of a sine wave gate voltage instead of a square wave reduces the high-transient noise level by reducing the very fast rise and fall times, but the use of sine waves reduces the speed of operation of the circuit and, further, renders the circuit unsuitable for producing an undistorted, gated representation of an analog signal.

It is consequently an object of the present invention to provide an economical, efficient FET switching circuit having substantially no transient noise components in the output thereof.

Briefly stated, the circuit of the preferred embodiment of the present invention utilizes the fact that the transient signals coupled to both the source and drain through the parasitic capacitance of the FET are identical. Two resistors of equal value are advantageously placed one in the source path and one in the drain path of the FET. A differential amplifier is then coupled to the source and drain terminals of the FET.

The identical voltages coupled to the source and drain terminals are thus arranged to be equally distributed in the source and drain paths thereby producing no net output from the differential amplifier.

It is thus a feature of the present invention that a differential amplifier and two equal-valued resistors are used to cancel equally distributed voltages in the source and drain paths of an FET switching circuit.

The foregoing and other objects and features of this invention and the manner of attaining them will become more apparent and the invention itself will be best understood by reference to the following description of an illustrative embodiment of the invention taken in connection with the accompanying drawings in which:

FIG. 1 is a schematic diagram of the illustrative embodiment of the present invention in the form of an FET analog gate circuit; and FIGS. 2A, 2B, 2C, 2D, 2E, and 2F are diagrams showing the waveforms appearing at various points in the circuit as shown in FIG. 1.

DETAILED DESCRIPTION

Figure 1:
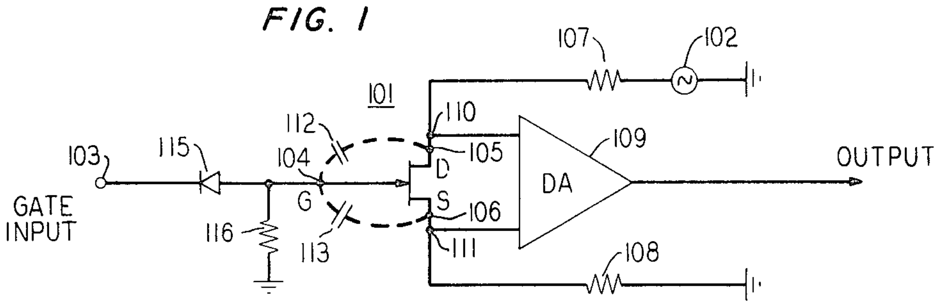
Figure 2A:
Figure 2B:
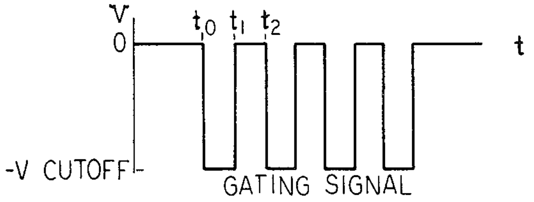
Figure 2C:
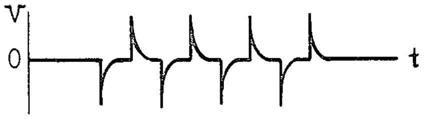

FIG. 1 shows an FET analog gate circuit for gating the analog signal of FIG. 2A. The analog signal of FIG. 2A is generated by analog signal source 102 of FIG. 1. FIG. 2B shows the gating signal which determines the rate at which the analog signal is sampled. The gating signal of FIG. 2B is applied by means of a pulse generator or its equivalent at gate input terminal 103. Other suitable gating signals may of course be used. Field effect transistor 101 is an N-type FET having a gate terminal 104, a drain terminal 105 and a source terminal 106. Clearly FET 101 is not restricted to N-type FET's and may be replaced with a suitable P-type device, keeping in mind the polarity inversion involved in the substitution. Illustratively, resistors 107 and 108 are of equal value. Resistor 107 is connected between drain terminal 105 and analog signal source 102 and resistor 108 is connected between source terminal 106 and a point of reference potential, such as ground. Differential amplifier 109 is connected such that input terminal 110 is coupled to the drain terminal 105 of FET 101 and the other input terminal 111 is coupled to source terminal 106 of FET 101. As shown in dashed notation in FIG. 1, an interelectrode capacitance 112 exists between gate terminal 104 and drain terminal 105 and an interelectrode capacitance 113 exists between gate terminal 104 and source terminal 106. The effect of interelectrode capacitances 112 and 113 is to couple a portion of the gate signal applied to gate input terminal 103 to the source and drain terminals of FET 101. If a gate signal of the form shown in FIG. 2B is applied to gate input terminal 103 and no analog signal is applied to the circuit, the signals coupled to the source and drain terminals 105 and 106 of FET 101 are the derivative of the gate signal (shown as FIG. 2C). If capacitors 112 and 113 are equal, as is the general case, the spikes as shown in FIG. 2C appear in identical form at the source and drain terminals; that is, they are of the same magnitude, and polarity and are in time phase.

For purposes of discussion, it is assumed that the gating signal depicted in FIG. 2B is the same at both gate input terminal 103 and FET gate terminal 104. In point of fact, however, the signal at gate input terminal 103 may exceed 0 volts (the maximum voltage shown on FIG. 2B) due to signal variations in the pulse generator. If this signal were coupled to gate terminal 104, it would cause the flow of gate current detrimentally affecting the gate's operation. To prevent this flow of gate current, the peak positive potential at gate terminal 104 is restricted (in this case, to 0 volts) by means of diode 115 and resistor 116 as shown in FIG. 1.

Because of the advantageous location of equal valued resistors 107 and 108, the voltages due to the spikes are caused to produce equal voltage drops in the source and drain paths of the FET. Differential amplifier 109 is then arranged to block signals appearing identically at the source and drain terminals. Thus, since the signals at source terminal 105 and drain terminal 106 are both as shown in FIG. 2C, the resultant output from differential amplifier 109 due to the gating signal is simply a fixed level DC voltage resulting from the offset voltage inherent in the operation of the differential amplifier. This offset may, according to the design of the differential amplifier, be zero volts, but is shown for purposes of illustration as K E in FIG. 2F.

Figure 2D:
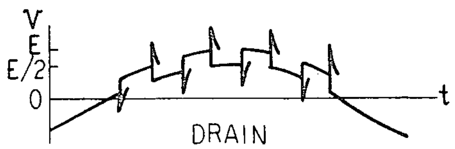
Figure 2E:
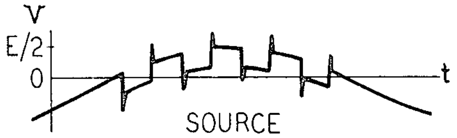
Figure 2F:
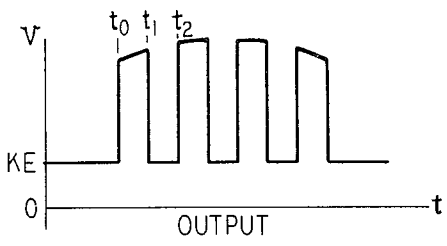

The circuit of FIG. 1 operates in the same manner when an analog signal, such as that shown in FIG. 2A, is applied by analog signal generator 102. The signal appearing at drain terminal 105 is shown in FIG. 2D and that appearing at source terminal 106 is shown in FIG. 2E. Accordingly, during the interval from $t_o$ to $t_1$, the gating signal causes FET 101 to be cut off. Consequently, no component of the analog signal is coupled to the source terminal. However, an exponentially decaying spike is produced by the negative-going gating signal and capacitor 113 at $t_o$ which is coupled to source terminal 106. A similar spike is simultaneously coupled through capacitor 112 to drain terminal 105. In addition, the analog signal appears undisturbed at drain terminal 105 during cutoff. During the interval from $t_1$ to $t_2$ FET 101 is in pinchoff and the analog signal is equally distributed in both the source and drain paths. Simultaneous transient spikes are also coupled to the source and drain through interelectrode capacitors 112 and 113. Consequently, during the interval from $t_o$ to $t_1$, the analog signal as it appears at the drain terminal is passed undisturbed by differential amplifier 109 and the identical transient spikes at the source and drain terminals are blocked. The waveform shown in FIG. 2F indicates the output from differential amplifier 109 as modified by the offset voltage produced by the differential amplifier. During the interval $t_1$ to $t_2$, the analog signals as well as the transient spikes are identical, resulting in no output from the differential amplifier from the contributing analog and gating signals.

The above-detailed description is illustrative of a specific embodiment of the present invention and it is to be understood that additional embodiments thereof will be obvious to those skilled in the art. In particular, the present invention is not limited to apparatus including field effect devices. Other analogous devices may be substituted therefor. Further, it is not required that the field effect or other device employed have equal parasitic capacitances therein nor that the source and drain resistors be equal in value. That is, the circuit may include compensation if the parasitic capacitors are unequal for a particular device by unbalancing the source and drain resistors. These resistors would then bear the same proportion to each other as the capacitors bear to each other.

I claim:

The claim. A circuit operative over a wide range of voltage levels including a source of reference potential for gating a first input signal in accordance with the magnitude of a second input signal comprising on an integrated circuit substrate a field effect transistor having source, drain and gate terminals, a differential amplifier having first and second input terminals and an output terminal, a first fixed resistor for applying said first signal to said drain terminal, a second fixed resistor for connecting said source terminal to said source of reference potential, first signal coupling means for applying said second signal to said gate terminal, second signal coupling means for connecting said first input terminal to said drain terminal, and third signal coupling means for connecting said second input terminal to said source terminal, wherein said filed effect transistor includes first and second parasitic capacitors of different value between said gate and drain and gate and source terminals respectively, and, wherein the values of said first and second fixed resistors bear the same proportion to each other as said first and second capacitors bear to each other.

* * * * *